United States Patent [19]
Swart et al.

[11] Patent Number: 5,821,810
[45] Date of Patent: Oct. 13, 1998

[54] METHOD AND APPARATUS FOR TRIM ADJUSTMENT OF VARIABLE GAIN AMPLIFIER

[75] Inventors: David Peter Swart, Pine Island; Gregory Scott Winn, Rochester, both of Minn.

[73] Assignee: International Business Machines Corporation, Armonk, N.Y.

[21] Appl. No.: 791,939

[22] Filed: Jan. 31, 1997

[51] Int. Cl.[6] .................................. H03F 3/45; G11B 5/00
[52] U.S. Cl. ............................. 330/254; 330/261; 360/46; 360/67
[58] Field of Search ................................ 330/2, 254, 261, 330/296; 360/46, 67, 68

[56] References Cited

U.S. PATENT DOCUMENTS

| | | | |
|---|---|---|---|
| 4,563,670 | 1/1986 | Stallkamp et al. | 340/347 |
| 5,115,409 | 5/1992 | Stepp | 364/841 |
| 5,379,457 | 1/1995 | Nguyen | 455/323 |
| 5,418,497 | 5/1995 | Martin | 331/48 |
| 5,432,475 | 7/1995 | Fukahori | 330/254 |
| 5,442,492 | 8/1995 | Cunningham et al. | 360/46 |
| 5,514,950 | 5/1996 | Sevenhans et al. | 323/315 |
| 5,515,014 | 5/1996 | Troutman | 332/178 |
| 5,521,545 | 5/1996 | Terry et al. | 327/359 |

OTHER PUBLICATIONS

"Improved DC Offset Trim Scheme For Gilbert Cell Variable Gain AMPL", IBM R0896–0026 Atty: Karuna Ojanen, Esquire Date May 30, 1996 Patentec: 5643.

*Primary Examiner*—James B. Mullins
*Attorney, Agent, or Firm*—Joan Pennington

[57] ABSTRACT

An improved method and apparatus are provided for dc offset trim adjustment of a variable gain amplifier. The VGA has predetermined overall gain endpoints. A minimum gain and a maximum gain are identified for the VGA in a preferred operational range. The identified minimum gain and the identified maximum gain for the VGA in the preferred operational range are spaced apart inwardly from the VGA predetermined overall gain endpoints. The minimum gain for the VGA in operation is set, then trim adjustment of the VGA is provided to minimize an output of the VGA. Then the maximum gain for the VGA in operation is set, then dc offset trim adjustment of the VGA is provided to minimize an output of the VGA.

10 Claims, 6 Drawing Sheets

METHOD AND APPARATUS FOR TRIM ADJUSTMENT OF VARIABLE GAIN AMPLIFIER

FIELD OF THE INVENTION

The present invention relates to a direct access storage device (DASD) of the type utilizing analog amplifier circuits in a data channel, such as a partial-response signaling and maximum-likelihood (PRML) detection channel, and more particularly, to an improved method and apparatus for DC offset trim adjustment of a variable gain amplifier.

DESCRIPTION OF THE PRIOR ART

Disk drive units often incorporating stacked, commonly rotated rigid magnetic disks are used for storage of data in magnetic form on the disk surfaces. Data is recorded in concentric, radially spaced data information tracks arrayed on the surfaces of the disks. Transducer heads driven in a path toward and away from the drive axis write data to the disks and read data from the disks. The transducer readback signal is applied to a data detection channel that includes a variable gain amplifier for amplifying the transducer readback signal.

In order to increase the signal to noise ratio (SNR) in an amplifier, there exists a desire to make the signal throughout the system as large as possible, with minimal total harmonic distortion (THD). A PRML channel can be used to achieve high data density in writing and reading digital data on the disks. In PRML disk drive read/write channels there exists a noisy environment as well as the need for minimal THD. Conventional data detection methods in PRML channels use a variable gain amplifier (VGA) in a Gilbert Cell topology to obtain the desired signal amplitude for signal processing. DC offset causes distortion as well as lack of usable dynamic range in an amplifier.

A need exists for an improved variable gain amplifier (VGA) that provides efficient and effective performance in a data detection channel, such as a partial-response signaling and maximum-likelihood (PRML) detection channel.

SUMMARY OF THE INVENTION

A principal object of the present invention is to provide a variable gain amplifier (VGA) that provides efficient and effective performance in a data detection channel, such as a partial-response signaling and maximum-likelihood (PRML) detection channel. Other important objects are to provide such variable gain amplifier (VGA) that can be implemented with available internal disk file hardware; to provide an improved method and apparatus for DC offset trim adjustment of the variable gain amplifier; to provide such method and apparatus substantially without negative effects and that overcome many of the disadvantages of prior art arrangements.

In brief, an improved method and apparatus are provided for DC offset trim adjustment of a variable gain amplifier. The VGA has predetermined overall gain endpoints. A minimum gain and a maximum gain are identified for the VGA in a preferred operational range. The identified minimum gain and the identified maximum gain for the VGA in the preferred operational range are spaced apart inwardly from the VGA predetermined overall gain endpoints. With no DC or AC input into the VGA, the minimum gain for the VGA in operation is set, then trim adjustment of the VGA is provided to minimize an output of the VGA. Then the maximum gain for the VGA in operation is set, then trim adjustment of the VGA is provided to minimize an output of the VGA.

BRIEF DESCRIPTION OF THE DRAWING

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

Figure 1:
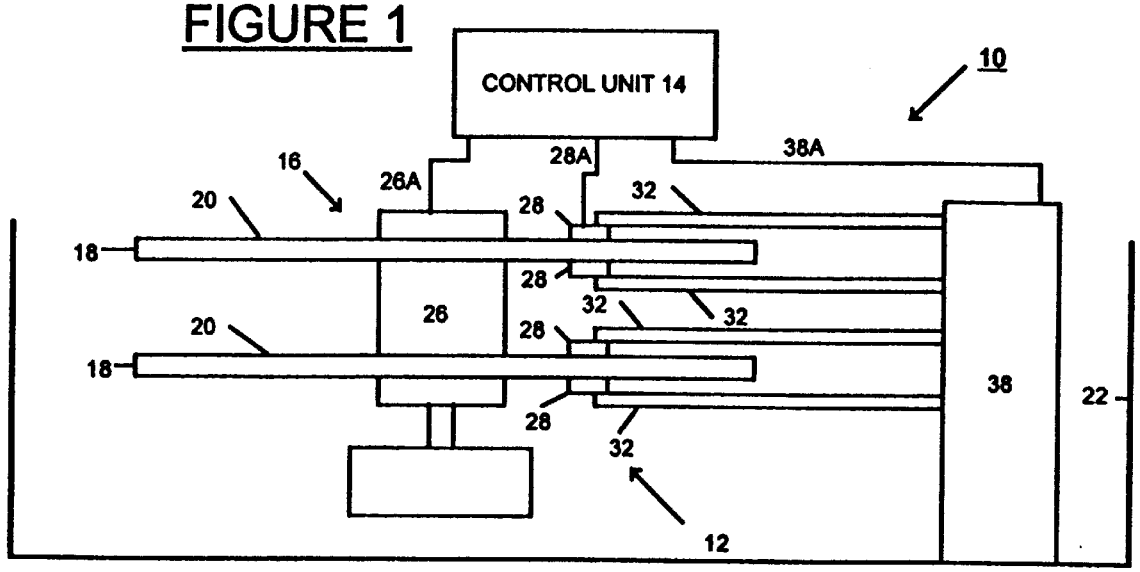
FIG. 1 is a schematic and block diagram of a data storage disk file embodying the present invention.
Figure 2:
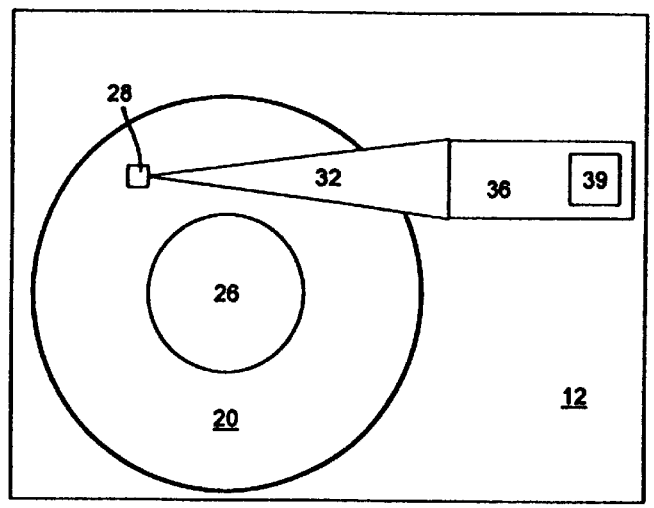
FIG. 2 is a schematic and block diagram plan view of the data storage disk file of FIG. 1.

Having reference now to the drawings, in FIGS. 1 and 2 there is illustrated a data storage disk file generally designated as 10 including a rigid magnetic disk drive unit 12 and an interface control unit generally designated as 14. Unit 12 is illustrated in simplified and diagrammatic form sufficient for an understanding of the present invention. The utility of the present invention is not restricted to the details of a particular drive unit construction.

The disk drive unit 12 includes a stack 16 of disks 18 each having at least one magnetic surface 20. The disks 18 are mounted parallel to one another within a housing 22 for simultaneous rotation on and by an integrated spindle and motor assembly 26. Information on each magnetic disk surface 20 is read from or written to the disk surface 20 by a corresponding transducer head assembly 28 movable in a path having a radial component across the rotating disk surface 20.

Each transducer head assembly 28 is carried by an arm 32. The arms 32 are ganged together for simultaneous pivotal movement by a head drive servo motor 38 including a voice coil 39 cooperating with an internal magnet and core assembly. Drive signals applied to the voice coil 39 cause the arms 32 to move in unison to position the transducer head assemblies 28 in registration with information storage tracks on the disk surfaces 20 where information is written or read.

The disk drive unit 12 is controlled in operation by signals provided by the control unit 14, including motor control signals on line 26A and head position control signals on line 38A. In a typical arrangement, control unit 14 provides an interface with a computer that provides data read and write commands, and data signals are transmitted to or from the transducer head assemblies over corresponding lines 28A, one of which is seen in FIG. 1. Servo position information is recorded on the disk surfaces 20, and the transducer head assemblies 28 read this servo information to provide a servo position signal to the control unit 14. This information is employed by the control unit 14 to provide position control signals on line 38A. The purpose of this position feedback system is to assure accurate and continuous positioning of the transducer head assemblies 28 so that data is written to and read from precise locations on the disk surfaces 20.

Figure 3:
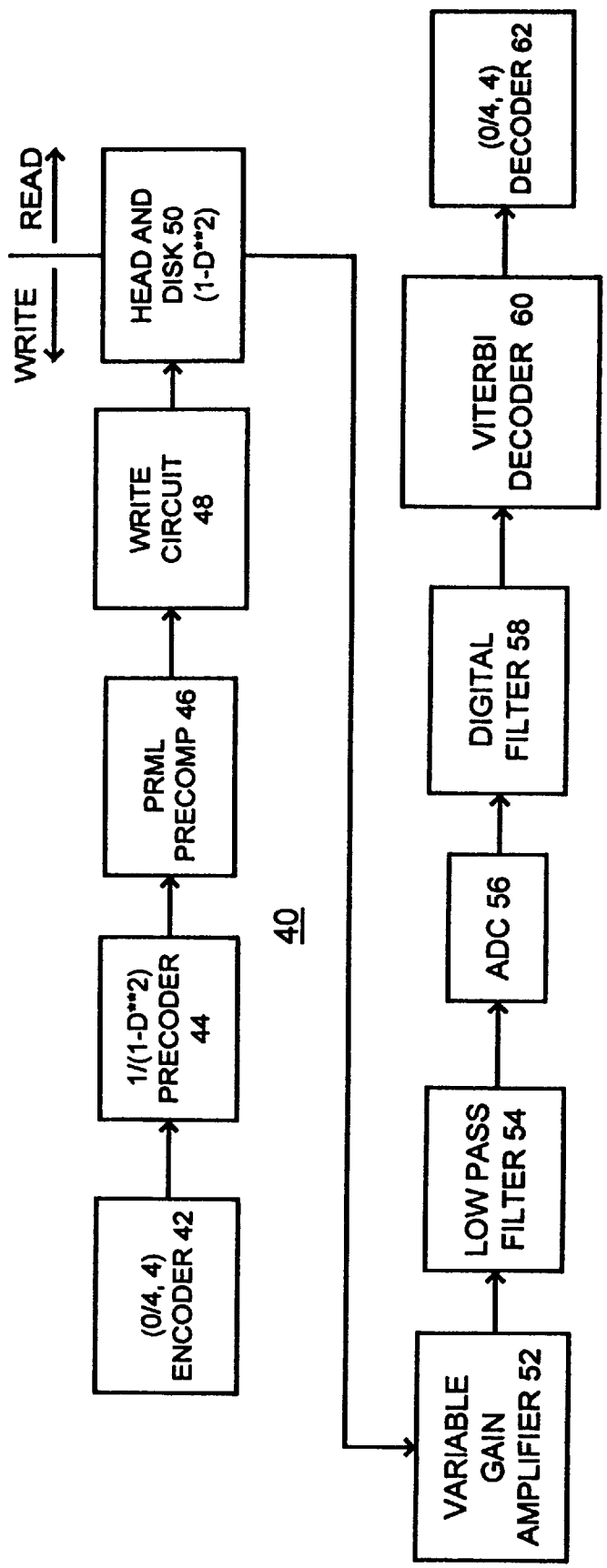
FIG. 3 is a schematic and block diagram illustrating a data channel of the data storage disk file of FIG. 1.

Referring now to FIG. 3, there is shown a block diagram of a partial-response maximum-likelihood (PRML) channel 40 available in the disk file 10 including a variable gain amplifier function of the invention. Data to be written is applied to an encoder 42 for providing a modulation coded output having predefined run length constraints, for example, such as, for the minimum and maximum number of consecutive zeros and the maximum run length of zeros in the even and odd recorded sequences in the overall recorded sequence. A precoder 44 follows the encoder 42 described by a $1/(1-D^2)$ operation where D is a unit delay operator. A PRML precomp 46 coupled to the precoder 44 provides a modulated binary pulse signal applied to a write circuit 48 that provides the modulated write current for writing to the disk surface. An analog read signal is obtained at head and disk block 50 described by the $(1-D^2)$ operation. The read signal is applied to a variable gain amplifier (VGA) 52 of the preferred embodiment and the amplified read signal is applied to a lowpass filter 54. The filtered read signal is converted to digital form by an analog-to-digital converter (ADC) 56 that provides, for example, such as 64 possible 6-bit sampled values.

The samples of the ADC 56 are applied to a digital filter 58, such as a 10 tap finite impulse response (FIR) digital filter. The filtered signal from the digital filter 58 is applied to a Viterbi decoder 60 coupled to a decoder 62 to complete the maximum-likelihood (ML) detection process for data read back.

Figure 4:
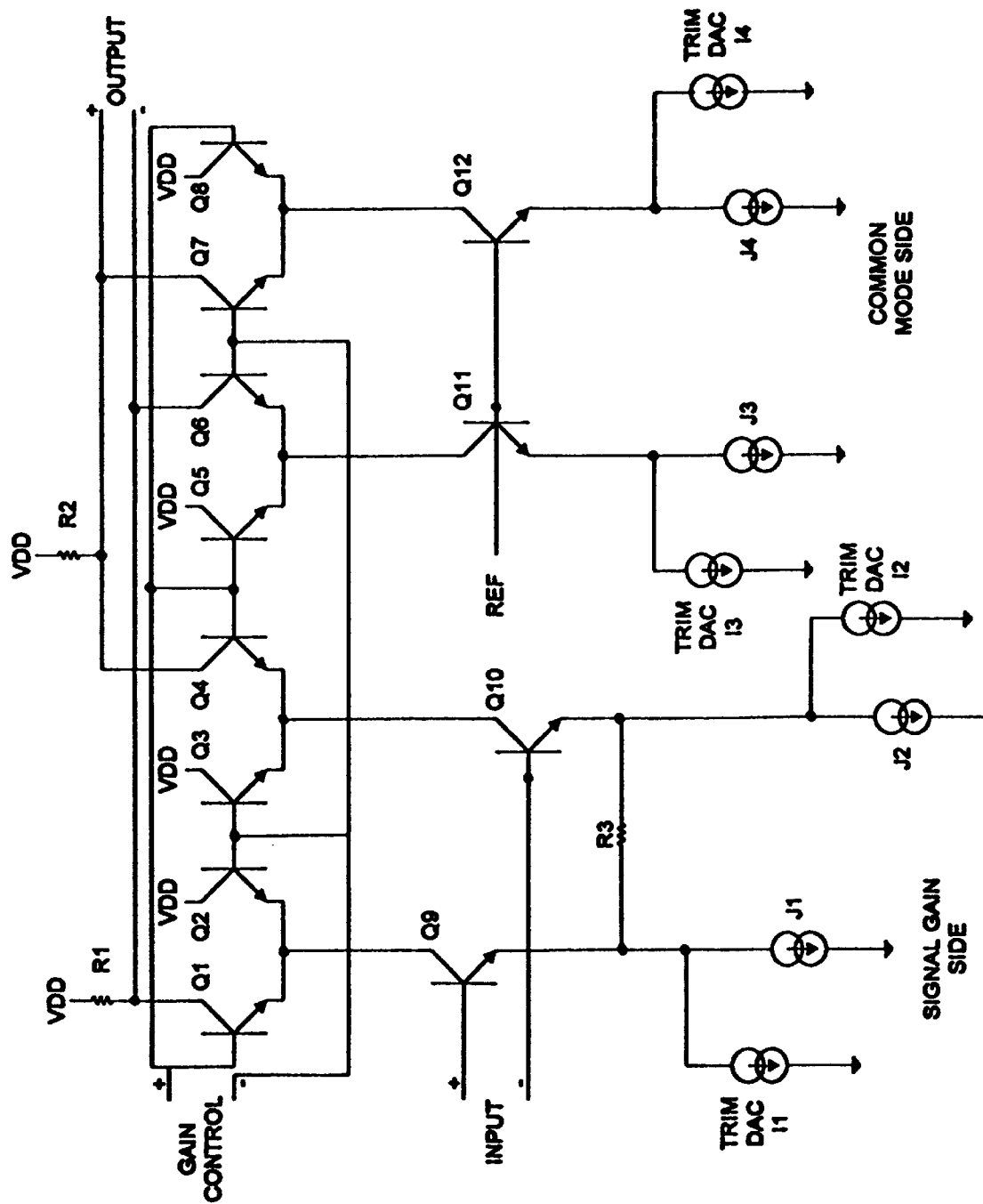
FIG. 4 is a schematic diagram illustrating a Gilbert cell variable gain amplifier (VGA) of the data channel of FIG. 3.

Referring to FIG. 4, there is shown a preferred embodiment of VGA 52 in a simplified schematic form. VGA 52 consists of a signal amplifier with gain control, a common-mode adjustment to keep the output DC bias point of the circuit constant, and trim digital-to-analog converters (DACs) for differentially reducing DC offset at a wafer level trim. A voltage input signal INPUT is applied to an NPN differential pair formed by NPN transistors Q9 and Q10 and emitter degeneration resistor R3. Gain control is provided by two differential pairs formed by NPN transistors Q1 and Q2, Q3 and Q4. The common-mode DC bias point adjustment is provided by two differential pairs formed by NPN transistors Q5 and Q6, Q7 and Q8 with reference voltage REF applied to the base of NPN transistors Q11, Q12 which keeps the current sources J3 and J4 operating in the same region as current sources J1 and J2. Current sources J1 and J2 provide a bias current to differential pairs Q1 and Q2, Q3 and Q4 via NPN transistors Q9, Q10 and current sources J3 and J4 provide a bias current to differential pairs Q5 and Q6, Q7 and Q8 via NPN transistors Q11, Q12. Four trim DACs I1, I2, I3, and I4 provide trim adjustment for respective current sources J1, J2, J3, and J4 for adjusting the DC offset at the output of the VGA 52. The amplified output signal is provided at the junction of respective resistors R1, R2 and the collectors of NPN bipolar transistors Q1, Q4, and Q6, Q7.

During trim adjustment, the DC levels at the collectors of the VGA bipolars Q1, Q4, Q6 and Q7 are adjusted to a minimum offset. Conventionally, trim adjustment is first done when the Gilbert Cell bipolars are in a fully switched minimum gain state with NPN transistors Q2, Q3, Q6, and Q7 conducting all of the current, and then in a maximum gain state with NPN transistors Q1, Q4, Q5, and Q8 conducting the current. The problem exists in the middle gain states when both bipolar transistors in each differential transistor pair Q1 and Q2, Q3 and Q4, Q5 and Q6, Q7 and Q8 are conducting current. In the conventional trim adjustment, VBE mismatch between the Gilbert Cell bipolar pairs Q1 and Q2, Q3 and Q4, Q5 and Q6, Q7 and Q8 is not trimmed out of the system.

Figure 5:
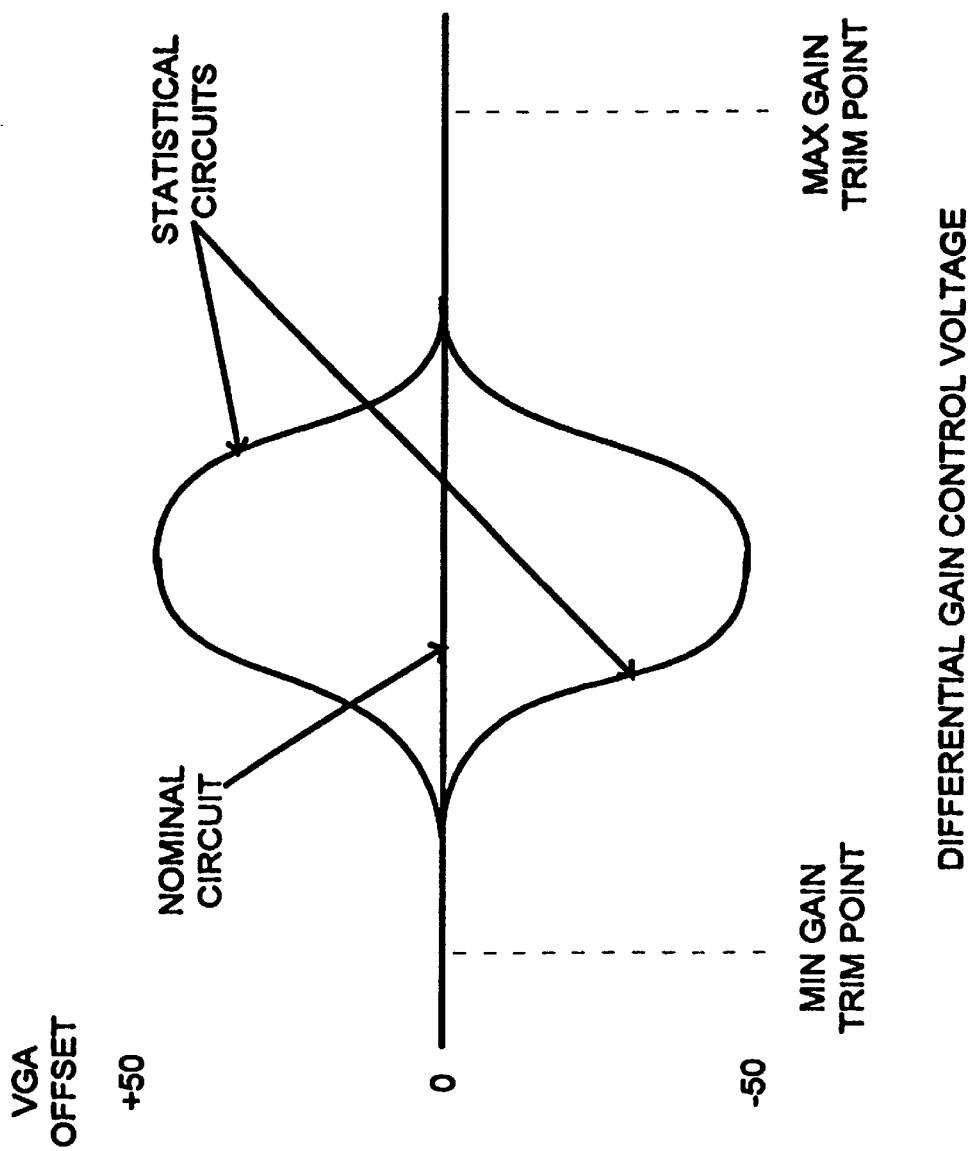
FIG. 5 is a chart illustrating a conventional DC offset of the Gilbert cell VGA with a prior art trim method.

Having reference to FIG. 5, an offset bubble is illustrated for the conventional trim adjustment. As shown in FIG. 5, at middle gain settings where VGA 52 is typically designed to operate, the offset statistically may be much worse than at the trimmed points. For a given circuit, the offset bubble may be either positive or negative and may have a magnitude ranging from zero to some maximum value such as + or −50 units as illustrated in FIG. 5. This DC offset will be significantly increased by the low pass filter 54 in FIG. 3 causing PRML signal distortion, poor performance in Bit Error Rate (BER), and larger than expected recovery times due to dc offset transients induced into the system during dynamic gain changes. In order to reduce the DC offset seen through the system at the more nominal, middle gain settings of the VGA, the VBE mismatches of the Gilbert Cell bipolars required a trim which corrects their mismatch with each other. Due to the circuit topology of the VGA 52, a simple middle gain trim is not feasible.

Figure 6:
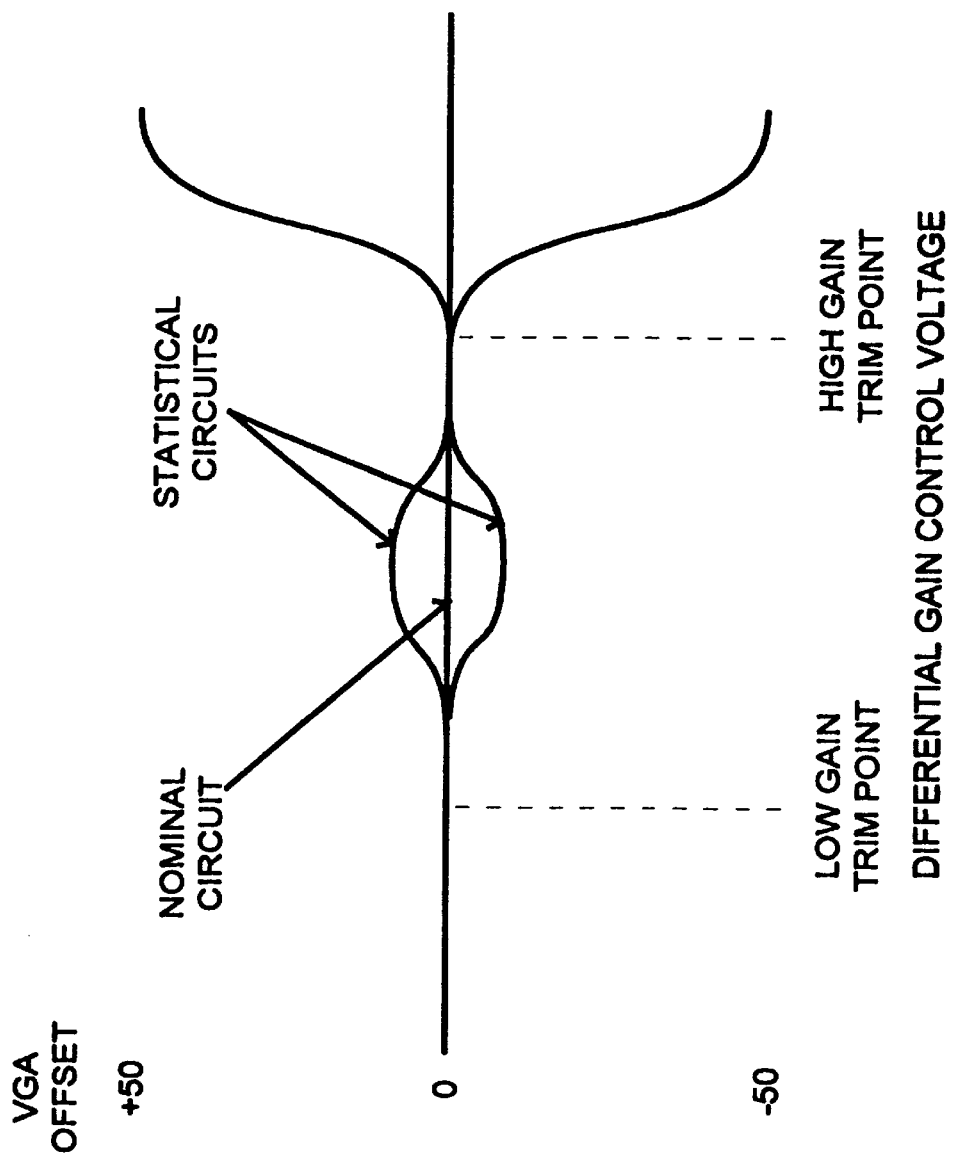
FIG. 6 is a chart illustrating a DC offset of the Gilbert cell VGA with a trim adjustment method of the invention.

As shown in FIG. 6, a reduced DC offset bubble is provided by an increase in the overall VGA gain and a change in trim adjustment technique of the invention. In FIG. 6, the low gain trim point and the high gain trim points are moved inwardly and spaced apart for the overall gain endpoints of the VGA 52. The trim method of the invention does not require additional trim bits to trim the DC offset. Through clever simulation it was determined that by trimming at a gain setting closer to the normal point of operation, away from the gain endpoints in FIG. 5, the offset bubble which occurred in a matched Gilbert Cell state could be reduced. A problem is that current PRML read paths require a large gain range to accommodate the variations of read-back signal amplitudes from the disk.

By designing extra gain into the VGA 52 in PRML channel 40, the trim points of the invention are moved into the gain range where both sides of the Gilbert Cell bipolar pairs Q1 and Q2, Q3 and Q4, Q5 and Q6, Q7 and Q8 are transmitting current, and the VBE mismatch is effectively trimmed out. DC offsets at gain settings outside the normal VGA operational range are large, as shown by the rapidly increasing VGA DC offset above the high gain trim point in FIG. 6, but performance and recovery times are not an issue at these high gain settings since they are outside of the operating range.

Figure 7:
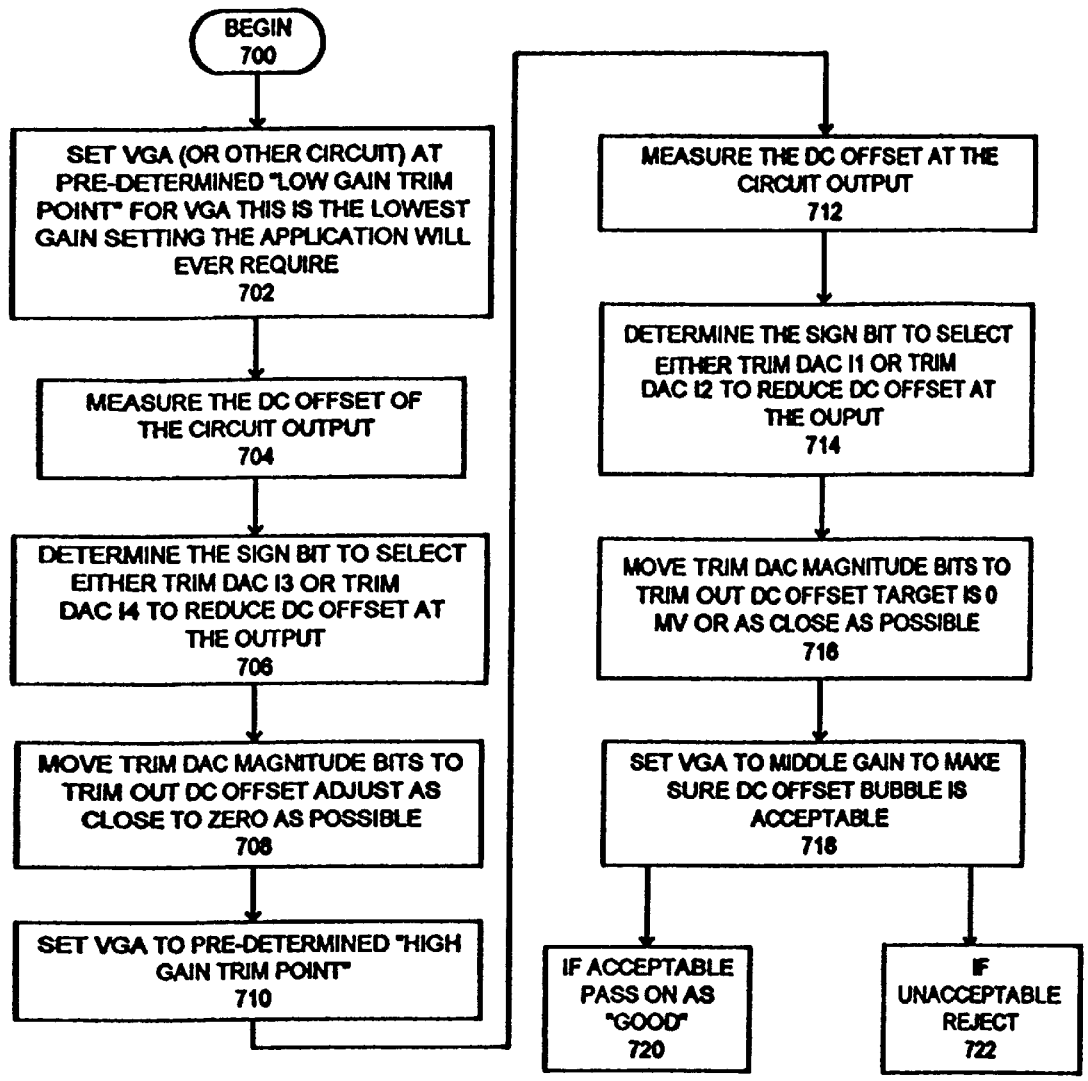
FIG. 7 is a flow chart illustrating sequential operations for trim adjustment of a Gilbert cell VGA of a data storage disk of FIG. 1 of the invention.

FIG. 7 illustrates sequential steps performed by control unit 14 for trim adjustment of the VGA 52 in accordance with the preferred embodiment beginning at block 700. With no DC or AC input into the VGA 52, the VGA 52 or other circuit is set at a predetermined low gain trim point for the VGA as indicated at a block 702. The low gain trim point is the lowest gain setting the application, such as, PRML channel 40 in disk file 10, will ever require. The DC offset of the circuit output or output of VGA 52 is measured as indicated at a block 704. The sign bit is identified to select either trim DAC I3 or trim DAC I4 required to reduce the DC offset at the output as indicated at a block 706. Next the trim DAC magnitude bits are moved to trim out the DC offset to adjust as close to zero millivolts as possible as indicated at a block 708. Next the VGA is set to the predetermined high gain trim point as indicated at a block 710. The predetermined high gain trim point is the highest gain setting the application will ever require, as illustrated in FIG. 6. The DC offset at the circuit output is again measured as indicated at a block 712. The sign bit is identified to selected either trim DAC I1 or trim DAC I2 to reduce the DC offset at the output as indicated at a block 714. Again the trim DAC magnitude bits are moved to trim out the DC offset with a target of zero millivolts or as close as possible as indicated at a block 716. Next the VGA is set to a middle gain and the DC offset bubble is checked to make certain the offset bubble is acceptable at the middle gain setting as indicated at a block 718. If acceptable, the VGA is passed as good as indicated at a block 720. Otherwise, if unacceptable, the VGA is rejected as indicated at a block 722.

It should be understood that the trim adjustment method of the preferred embodiment includes calibration adjustment and can be performed multiple times during the life of the disk file. While the present invention has been described with reference to the details of the embodiments of the invention shown in the drawing, these details are not intended to limit the scope of the invention as claimed in the appended claims.

What is claimed is:

1. A method for trim adjustment of a variable gain amplifier (VGA) used in a direct access storage device (DASD), the VGA having predetermined overall gain endpoints, said method comprising the steps of:

identifying a minimum gain and a maximum gain for the VGA in a preferred operational range in the DASD; said identified minimum gain and said identified maximum gain for the VGA in said preferred operational range in the DASD being moved inwardly and spaced apart from the VGA predetermined overall gain endpoints;

setting said minimum gain for the VGA in said preferred operational range and trim adjusting the VGA to minimize an output of the VGA; and setting said maximum gain for the VGA in said preferred operational range and trim adjusting the VGA to minimize an output of the VGA.

2. A method for trim adjustment of a variable gain amplifier (VGA) used in a direct access storage device (DASD) as recited in claim 1 further includes the step of: setting a generally middle gain of the VGA between said identified minimum gain and said identified maximum gain for the VGA in said preferred operational range in the DASD.

3. A method for trim adjustment of a variable gain amplifier (VGA) used in a direct access storage device (DASD) as recited in claim 2 further includes the steps of: responsive to said middle gain setting step, checking a DC offset of the VGA and either accepting or rejecting the VGA responsive to said DC offset checking.

4. A method for trim adjustment of a variable gain amplifier (VGA) used in a direct access storage device (DASD) as recited in claim 1 wherein the variable gain amplifier (VGA) is a Gilbert cell VGA including four differential transistor pairs for gain and common mode control and wherein the steps of identifying a minimum gain and a maximum gain for the VGA in a preferred operational range in the DASD includes the steps of: identifying a low gain and a high gain in an operational range for the VGA wherein each transistor of said four differential transistor pairs are conducting current.

5. Apparatus for trim adjustment of a variable gain amplifier (VGA) used in a direct access storage device (DASD) comprising:

means for identifying a minimum gain and a maximum gain for the VGA in a preferred operational range in the DASD; said identified minimum gain and said identified maximum gain for the VGA in said preferred operational range in the DASD being spaced inwardly from the VGA predetermined overall gain endpoints;

means for setting said minimum gain for the VGA in said preferred operational range and for trim adjusting the VGA to minimize an output of the VGA; and means for setting said maximum gain for the VGA in said preferred operational range and for trim adjusting the VGA to minimize an output of the VGA.

6. Apparatus for trim adjustment of a variable gain amplifier (VGA) used in a direct access storage device (DASD) as recited in claim 5 further includes means for setting a generally middle gain of the VGA between said identified minimum gain and said identified maximum gain for the VGA in said preferred operational range in the DASD and means responsive to said middle gain setting means for checking a DC offset of the VGA and means for either accepting or rejecting the VGA responsive to said DC offset checking means.

7. A Gilbert cell variable gain amplifier (VGA) comprising:

input means for receiving a voltage input signal;

output means for providing an amplified output signal; said amplified output signal having predetermined overall gain endpoints greater than a preferred operational range of the VGA;

four differential transistor pairs coupled to said input means for providing gain and common mode control;

digital-to-analog converter (DAC) trimming means coupled to said four differential transistor pairs for trim adjustment of said four differential transistor pairs at a low gain setting and at a high gain setting in said preferred operational range of the VGA for adjusting a DC output.

8. A Gilbert cell variable gain amplifier (VGA) as recited in claim 7 wherein said each transistor of said four differential transistor pairs is conducting at said low gain and at said high gain setting in said preferred operational range of the VGA.

9. A Gilbert cell variable gain amplifier (VGA) as recited in claim 7 wherein said low gain setting and said high gain setting are moved inwardly and spaced apart from said predetermined overall gain endpoints of the VGA.

10. A Gilbert cell variable gain amplifier (VGA) as recited in claim 7 includes a respective current source coupled to each of said four differential transistor pairs and wherein said digital-to-analog converter (DAC) trimming means is coupled to each respective current source.

* * * * *